(12) United States Patent
Okawa et al.

(10) Patent No.: US 9,166,040 B2
(45) Date of Patent: Oct. 20, 2015

(54) SEMICONDUCTOR DEVICE

(71) Applicant: TOYOTA JIDOSHA KABUSHIKI KAISHA, Toyota-shi, Aichi-ken (JP)

(72) Inventors: Takashi Okawa, Nisshin (JP); Hiroomi Eguchi, Seto (JP); Hiromichi Kinpara, Seto (JP); Satoshi Ikeda, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/626,223

(22) Filed: Feb. 19, 2015

(65) Prior Publication Data

US 2015/0243778 A1 Aug. 27, 2015

(30) Foreign Application Priority Data

Feb. 26, 2014 (JP) ................................. 2014-034863

(51) Int. Cl.
 *H01L 29/78* (2006.01)
 *H01L 29/10* (2006.01)
(52) U.S. Cl.
 CPC ........ *H01L 29/7816* (2013.01); *H01L 29/1095* (2013.01)

(58) Field of Classification Search
 None
 See application file for complete search history.

(56) References Cited

U.S. PATENT DOCUMENTS

| 6,599,782 | B1 * | 7/2003 | Kikuchi et al. | 438/147 |
| 7,279,768 | B2 * | 10/2007 | Kanda et al. | 257/491 |
| 8,106,451 | B2 * | 1/2012 | Khalil | 257/339 |
| 2010/0200936 | A1 * | 8/2010 | Saito et al. | 257/409 |

FOREIGN PATENT DOCUMENTS

JP 2012209459 A 10/2012

* cited by examiner

*Primary Examiner* — Scott B Geyer

(57) ABSTRACT

A semiconductor device disclosed herein is provided with: a source electrode; a gate electrode; a drain electrode; a first region of a first conductivity type formed in a range exposed at an upper surface of the semiconductor substrate a second region of a second conductivity type; a third region of the first conductivity type; and a fourth region of the first conductivity type. The fourth region includes: a first drift region formed in a range exposed at the upper surface; a second drift region having a first conductivity type impurity concentration higher than that of the first drift region, and adjacent to the first drift region; and a low concentration drift region having a first conductivity type impurity concentration lower than that of the first drift region. The first drift region is projected to a second region side than the second drift region.

4 Claims, 8 Drawing Sheets

SEMICONDUCTOR DEVICE

CROSS-REFERENCE TO RELATED APPLICATION

This application claims priority to Japanese Patent Application No. 2014-34863 filed on Feb. 26, 2014, the contents of which are hereby incorporated by reference into the present application.

TECHNICAL FIELD

The present application relates to a semiconductor device.

DESCRIPTION OF RELATED ART

For example, Japanese Patent Application Publication No. 2.012-209459 discloses a semiconductor device having lateral MISFET. This semiconductor device comprises an n-type drift region being formed in a range exposed at an upper surface of a semiconductor substrate and having an n-type impurity concentration lower than an n-type active region, on the upper surface side of the n-type active region. Accordingly, a flow of a current concentrated in an upper surface region of the semiconductor substrate at the time of a turn-on operation is suppressed.

However, in the semiconductor device of Japanese Patent Application Publication No. 2012-209459, the flow of a current tends to be concentrated in the vicinity of the upper surface of the n-type active region at the time of a turn-on operation. By the flow of a current concentrated in the vicinity of the upper surface of the n-type active region, local heating of the semiconductor device easily occurs.

The present invention provides a semiconductor device capable of suppressing the local heating.

BRIEF SUMMARY OF INVENTION

A first aspect of a technique described in this specification is a semiconductor device. The semiconductor device comprises: a source electrode; a gate electrode; a drain electrode; a semiconductor substrate; a first region of a first conductivity type formed in a range exposed at an upper surface of the semiconductor substrate, and making contact with the source electrode; a second region of a second conductivity type formed in a range exposed at the upper surface, adjacent to the first region, and facing the gate electrode through a gate insulating layer; a third region of the first conductivity type formed in a range exposed at the upper surface, and making contact with the drain electrode; and a fourth region of the first conductivity type formed in a range exposed at the upper surface, formed between the second region and the third region, and comprising; a first drift region formed in a range exposed at the upper surface between the second region and the third region; a second drift region having a first conductivity type impurity concentration higher than that of the first drift region, and adjacent to the first drift region positioned between the second region and the third region; and a low concentration drift region having a first conductivity type impurity concentration lower than that of the first drift region, and formed between the second region and the second drift region, Wherein both of the first drift region and the second drift region are adjacent to the third region, and the first drift region is projected to a second region side than the second drift region.

With the above aspect, local heating can be suppressed.

DETAILED DESCRIPTION OF INVENTION

First Embodiment

Figure 1:
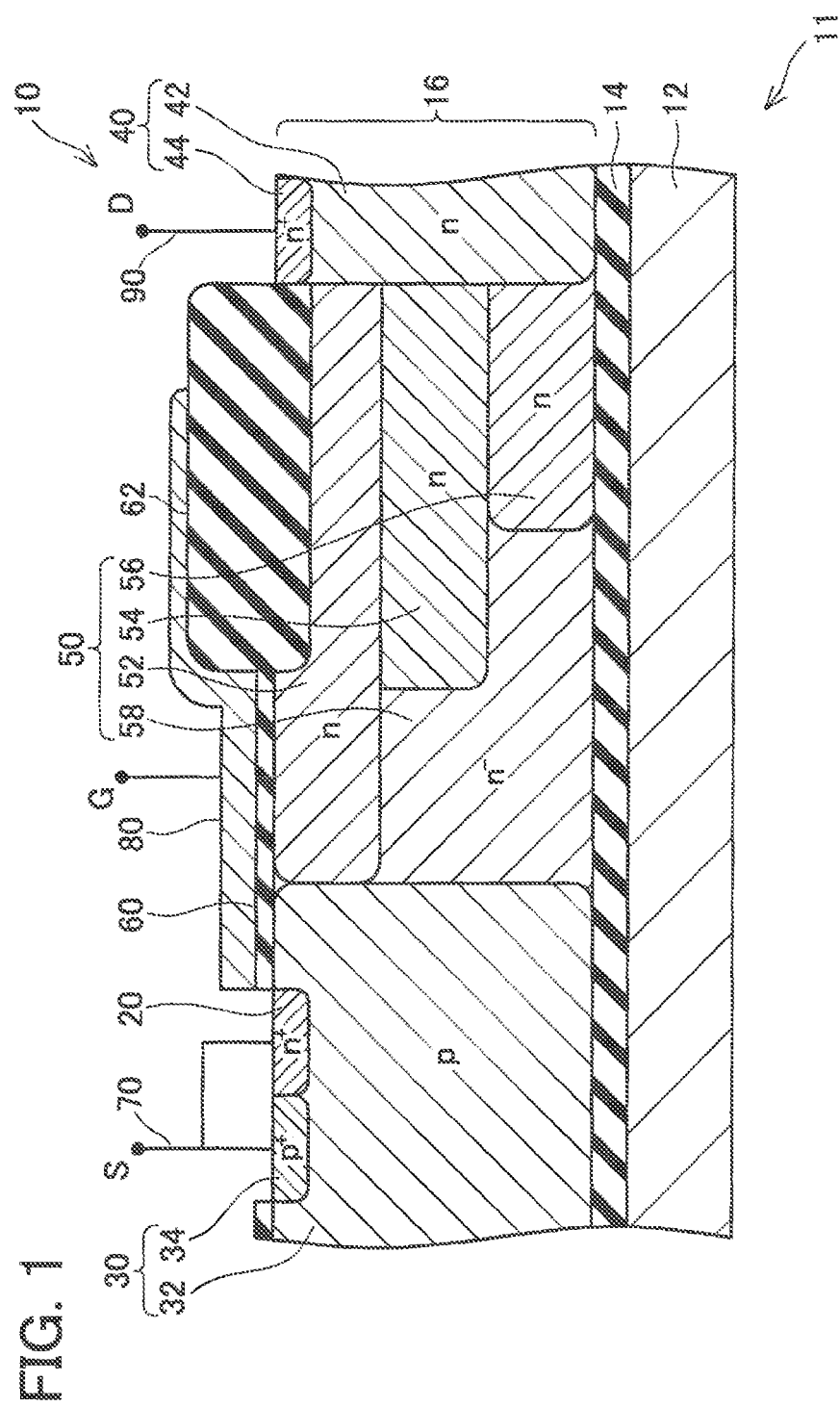
FIG. 1 shows a cross-sectional view of a semiconductor device of the first embodiment.

As shown in FIG. 1, a semiconductor device 10 of the present embodiment has a semiconductor substrate 11 mainly formed of Si. The semiconductor substrate 11 has a rear surface layer 12, an embedded insulating film 14 formed on an upper surface side (an upper side in FIG. 1) of the rear surface layer 12, and a semiconductor layer 16 formed on an upper surface side of the embedded insulating film 14. The upper surface of the semiconductor substrate 11 is provided with a gate insulating film 60, a LOCOS oxide film 62, a source electrode 70, a gate electrode 80, a drain electrode 90, a metal wiring (not shown), and the like. The semiconductor device 10 of the present embodiment is a lateral n-channel MOSFET.

In the semiconductor layer 16, an n-type source region 20, a p-type body region 30, an n-type drain region 40, and an n-type drift region 50 are provided. The source region 20, the body region 30, the drain region 40, and the drift region 50 are formed in a range exposed at an upper surface of the semiconductor layer 16. The drift region 50 is provided between the body region 30 and the drain region 40.

The source region 20 is formed in a range exposed at an upper surface of the semiconductor layer 16. The source region 20 has an n-type impurity concentration higher than the drift region 50. The upper surface of the source region 20 makes contact with the source electrode 70.

The body region 30 has a hi concentration region 34 having a high p-type impurity concentration and a low-concentration region 32 having a p-type impurity concentration lower than the high concentration region 34. The body region 30 is adjacent to the source region 20, The body region 30 is formed to a depth reaching an upper surface of the embedded insulating film 14. The body region 30 faces the gate electrode 80 through the gate insulating film 60. The body region 30 makes contact with the source electrode 70.

The drift region 50 is adjacent to the body region 30 and the drain region 40. The drift region 50 is separated from the source region 20 by the body region 30. The drift region 50 has a first drift region 52, a second drift region 54, a third drift region 56, and a low-concentration drift region 58. A relationship among an n-type impurity concentration N1 in the first drift region 52, an n-type impurity concentration N2 in the second drift region 54, an n-type impurity concentration N3 in the third drift region 56, and an n-type impurity concentration N4 in the low concentration drift region 58 is N4<N1<N2<N3.

The first drift region 52 is formed in a range exposed at an upper surface of the semiconductor layer 16 between the body region 30 and the drain region 40. The first drift region 52 is adjacent to the drain region 40. The first drift region 52 is projected to the body region 30 side than the second drift region 52. The first drift region 52 is adjacent to the body region 30.

The second drift region 54 is provided below the first drift region 52 and is adjacent to the first drift region 52. In this case, "below" means a far side from the upper surface of the semiconductor substrate 11. The same applies hereinafter in the specification. The second drift region 54 is adjacent to also the drain region 40. The second drift region 54 is projected to a body region 30 side than the third drift region 56. Note here that the second drift region 54 is not in contact with the body region 30.

The third drift region 56 is provided below the second drift region 54 and is adjacent to the second drift region 54. The third drift region 56 is adjacent to also the drain region 40. The third drift region 56 also is not in contact with to the body region 30.

The low-concentration drift region 58 is formed between the body region 30 and the second drift region 54 and between the body region 30 and the third drift region 56.

The drain region 40 has a high-concentration region 44 having a high n-type impurity concentration and a low-concentration region 42 having an n-type impurity concentration lower than the high concentration region 44. The drain region 40 is formed to a depth adjacent to an upper surface of the embedded insulating film 14. The drain region 40 is adjacent to the drift region 50. The upper surface of the drain region 40 makes contact with the drain electrode 90.

In the present embodiment, the first drift region 52, the second drift region 54, and the third drift region 56 are adjacent to the low-concentration region 42 of the drain region 40. The low-concentration region 42 has an n-type impurity concentration higher than the first drift region 52, the second drift region 54, and the third drift region 56. Note here that the low-concentration region 42 may have an n-type impurity concentration lower than any or all of the first drift region 52, the second drift region 54, and the third drift region 56.

As shown in FIG. 1, the gate insulating film 60 is formed over an entirety of the upper surface of the body region 30 and the upper surface of a part of the drift region 50. The LOCOS oxide film 62 is formed on an upper surface of the other part of the drift region 50 in which the gate insulating film 60 is not formed. The gate electrode 80 is formed over an entirety of the upper surface of the gate insulating film 60 and the upper surface of a part of the LOCOS oxide film 62. As described above, the gate electrode 80 faces, via the gate insulating film 60, a region of the body region 30 between the source region 20 and the first drift region 52.

Next, an operation of the semiconductor device 10 of the present embodiment is described below. A voltage (i.e., a forward voltage to the semiconductor device 10) is applied between the source electrode 70 and the drain electrode 90 so that the drain electrode 90 can be a positive electrode, and a predetermined on electric potential is applied to the gate electrode 80, so that the semiconductor device 10 is turned on.

That is, an n-type channel (not shown) is formed in the vicinity of the upper surface of the body region 30 between the source region 20 and the drift region 50, and carriers (electrons) move from the source region 20 toward the drift region 50 and the drain region 40 through the channel. Accordingly, a current flows from the drain electrode 90 to the source electrode 70.

Figure 2:
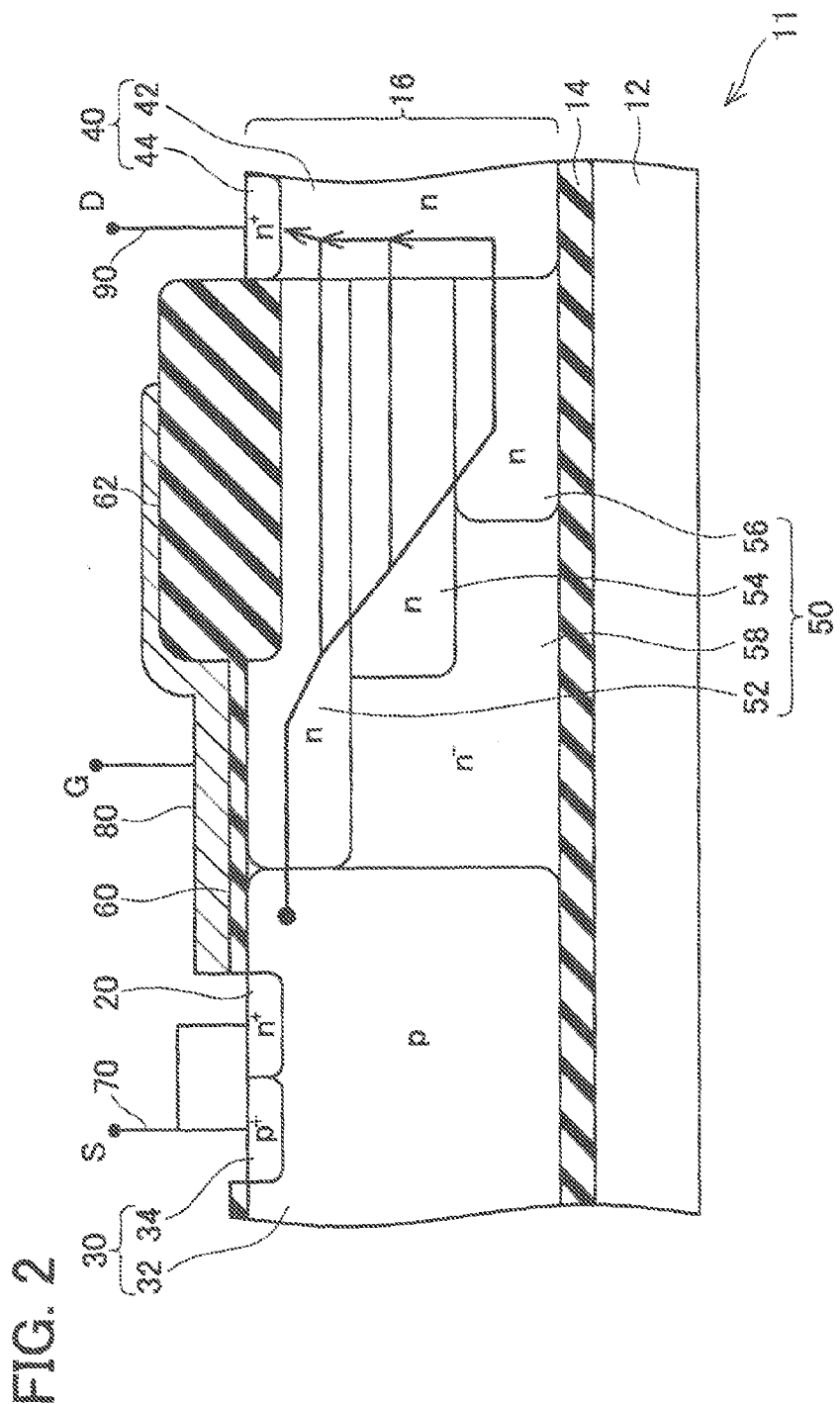
FIG. 2 schematically shows the state at the time of a turn-on operation of the semiconductor device of the first embodiment.

Referring to FIG. 2, an action of an electrons at the time of a turn-on operation of the semiconductor device 10 is described in detail. The electrons having passed through the channel are introduced into the first drift region 52. As described above, the first drift region 52 is formed in a range exposed at an upper surface of the semiconductor layer 16 between the body region 30 and the drain region 40. In other words, the first drift region 52 is formed at a position near the channel formed in the body region 30. The first drift region 52 is adjacent to the body region 30. The n-type impurity concentration N1 in the first drift region 52 is higher than the n-type impurity concentration N4 in the low concentration drift region 58. The electrons easily flow (i.e., a resistance therefor is low) in the first drift region 52 having a high n-type impurity concentration compared with the low-concentration drift region 258 having a low n-type impurity concentration. Therefore, most of the electrons passed through the n-type channel are not introduced into the low-concentration drift region 58, but are introduced into the first drift region 52.

Some of the electrons introduced into the first drift region 52 pass through the first drift region 52 and are introduced into the drain region 40. On the other hand, the electrons introduced into the first drift region 52 partially are introduced into the second drift region 54 that is adjacent to the first drift region 52. As described above, the n-type impurity concentration N2 in the second drift region 54 is higher than the n-type impurity concentration N1 in the first drift region 52. Therefore, the electrons easily flow (i.e., a resistance therefor is low) in the second drift region 54 compared with the first drift region 52. Thus, the other electrons introduced into the first drift region 52 are introduced into the second drift region 54.

Similarly, some of the electrons introduced into the second drift region 54 pass through the second drift region 54 and are introduced into the drain region 40. The other electrons introduced into the second drift region 54 are introduced into the third drift region 56 that is adjacent to the second drift region 54. The electrons introduced into the third drift region 56 pass through the third drift region 56 and are introduced into the drain region 40.

As described above, in the semiconductor device 10 of the present embodiment, an electrons passed through the n-type channel at the time of a turn-on operation are spread in the first drift region 52, the second drift region 54, and the third drill region 56 and is introduced into the drain region 40. Accordingly, the concentration of electric field at the interface between the drift region 50 and the drain region 40 is relaxed. Furthermore, a path through which a current flows at the time of the turn-on operation of the semiconductor device 10 is spread into an upper path and a lower path, i.e., in a vertical direction. Thus, local heating of the semiconductor device 10 can be suppressed.

Figure 3:
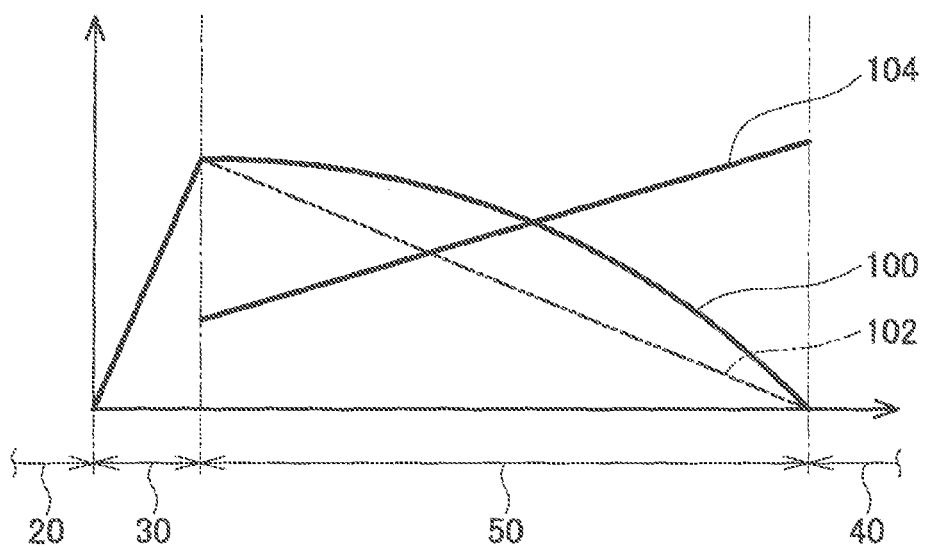
FIG. 3 is a graph schematically showing a distribution of the average value of the dopant amount and a graph schematically showing an electric field strength in the first embodiment.

The graph 104 of FIG. 3 schematically shows a distribution of the average value of the do pant amount in the semiconductor layer 16 between the source region 20 and the drain region 40 in the depth direction. The graph 100 of FIG. 3 schematically shows an electric field strength of the semiconductor layer 16 between the source region 20 and the drain region 40 when the semi semiconductor device 10 is off. As described above, the second drift region 54 and the third drift region 56 having high n-type impurity concentrations are arranged in the drift region 50 so as to be close to the drain region 40 side. Therefore, as shown in the graph 104, the drift region 50 exhibits gradually greater average values of the dopant amount in the depth direction as the region is closer to the side of the drain region 40. As described above, since the average value of the dopant amount is spread, the electric field is spread in the semiconductor layer 16 as shown in the graph 100 when the semiconductor device 10 is off.

The graph 102 of FIG. 3 schematically shows an electric field strength of the semiconductor layer 16 between the source region 20 and the drain region 40 when the semiconductor device 10 of comparative embodiment is off. In the semiconductor device of comparative embodiment, the average value of the n-type impurity concentration (dopant amount) in the drift region 50 in the depth direction is constant. As described above, in the case where the average value of the dopant amount is spread, the electric field is spread as shown in the graph 102 when the semiconductor device is off.

As evidenced by comparison of the graph 100 and the graph 102, the electric field is easily concentrated at the interface region between the body region 30 and the drift region 50 in the semiconductor device of comparative example, compared with the semiconductor device 10 of the present embodiment. That is, in the semiconductor device 10 of the present embodiment, the concentration of the electric field in the semiconductor layer 16 is suppressed. This is because the dopant amount in the drift region 50 is gradually increased as the region is closer to the drain region 40 side as shown in the graph 104. Therefore, in the semiconductor device 10 of the present embodiment, a withstand voltage is high.

Moreover, in the semiconductor device 10 of the present embodiment, the first drift region 52 is adjacent to the body region 30. Therefore, a resistance until the introduction of the carriers into the first drift region 52 after passing through the channel is low compared with the case where the first drift region 52 is not adjacent to the body region 30. Therefore, a loss at the time of the turn-on operation of the semiconductor device 10 is small.

In the above-mentioned example, the n-type impurity concentration N4 in the low-concentration drift layer 58 is, for example, less than $1 \times 10^{15}$ atoms/cm$^3$. The n-type impurity concentration N1 in the first drift region 52 is, for example, from $1 \times 10^{15}$ atoms/cm$^3$ or more and less than $1 \times 10^{16}$ atoms/cm$^3$. The n-type impurity concentration N2 in the second drift region 54 is, for example, from $1 \times 10^{16}$ atoms/cm$^3$ or more and $1 \times 10^{17}$ atoms/cm$^3$. The n-type impurity concentration N3 in the third drift region 56 is, for example, $1 \times 10^{17}$ atoms/cm$^3$ or more.

The structure and the operation of the semiconductor device 10 of the present embodiment is described above. The source region 20 of the present embodiment shows an example of "first region". The body region 30 shows an example of "second region". The drain region 40 shows an example of "third region". The drift region 50 shows an example of "fourth region".

Second Embodiment

A semiconductor device 200 of the second embodiment is described below with reference to FIGS. 4 to 8 based on differences from the first embodiment. The configuration of the semiconductor device 200 of the present embodiment is basically identical to that of the device in the tint embodiment. Note here that the structure of a drift region 250 in the semiconductor device 200 of the present embodiment is different from the first embodiment.

Figure 4:
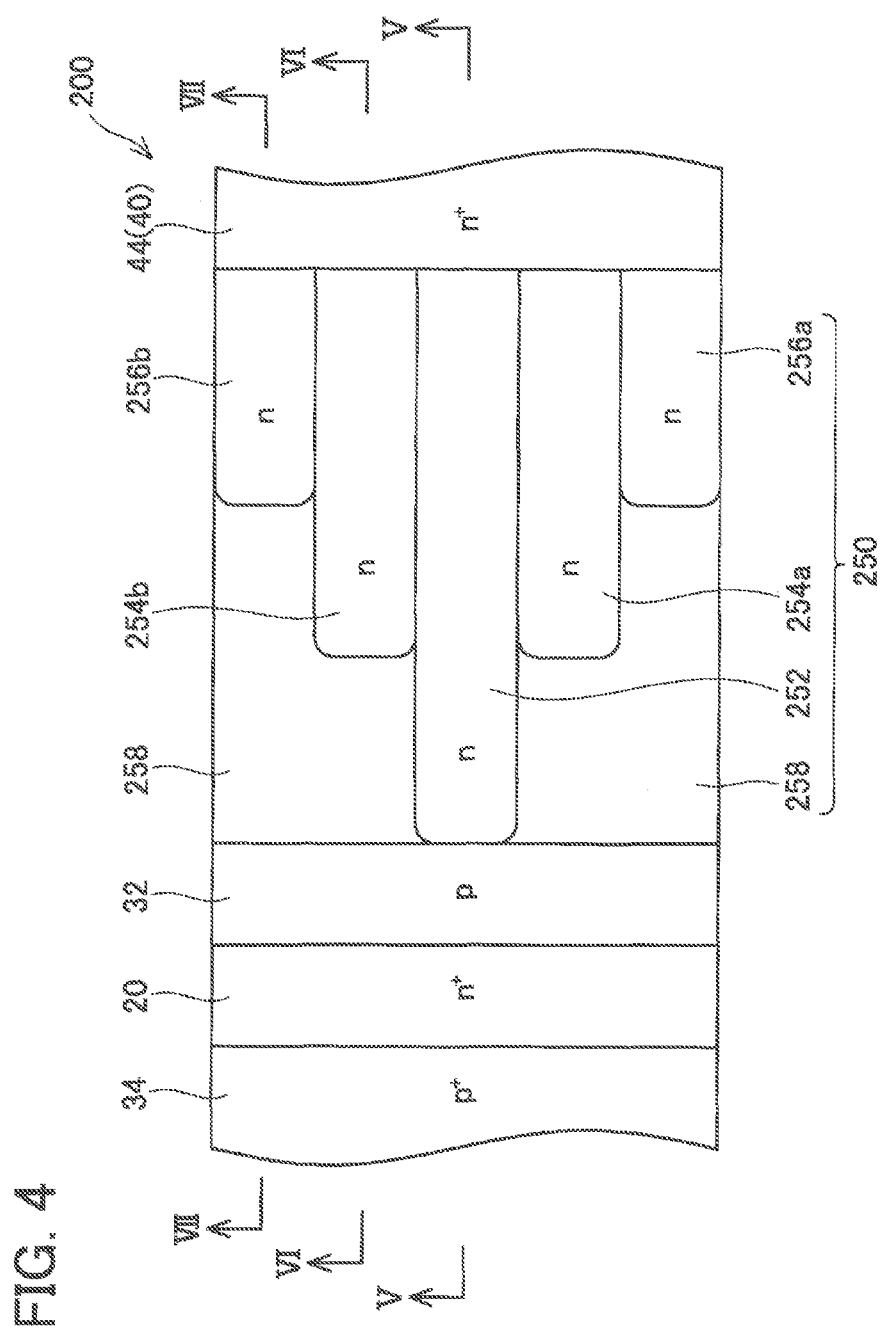
FIG. 4 schematically shows a plan view of a semiconductor device of the second embodiment.

As shown in FIG. 4, the drift region 250 of the present embodiment also has a first drift region 252, second drift regions 254a and 254b, a third drift regions 256a and 256b, and a low-concentration drift region 258. In the present embodiment, a relationship among an n-type impurity concentration N1 in the first drift region 252, an n-type impurity concentration N2 in the second drift regions 254a and 254b, an n-type impurity concentration N3 in the third drift regions 256a and 256b, and an n-type impurity concentration N4 in the low-concentration drift region 258 is also N4<N1<N2<N3. Note here that the present embodiment is different from the first embodiment in that the second drift regions 254a and 254b are provided on both sides of the first drift region 252, the third drift region 256b is provided on a side of the second drift region 254a, and the third drift region 256b is provided on a side of the second drift region 254b, as shown in FIGS. 4 to 7. The "side" means the lateral side on a plane which is parallel to the upper surface of a semiconductor substrate 11. The same applies hereinafter in the specification. In FIG. 4, illustrations of a gate insulating film, a LOCOS oxide film, various electrodes, and the like are omitted.

Figure 5:
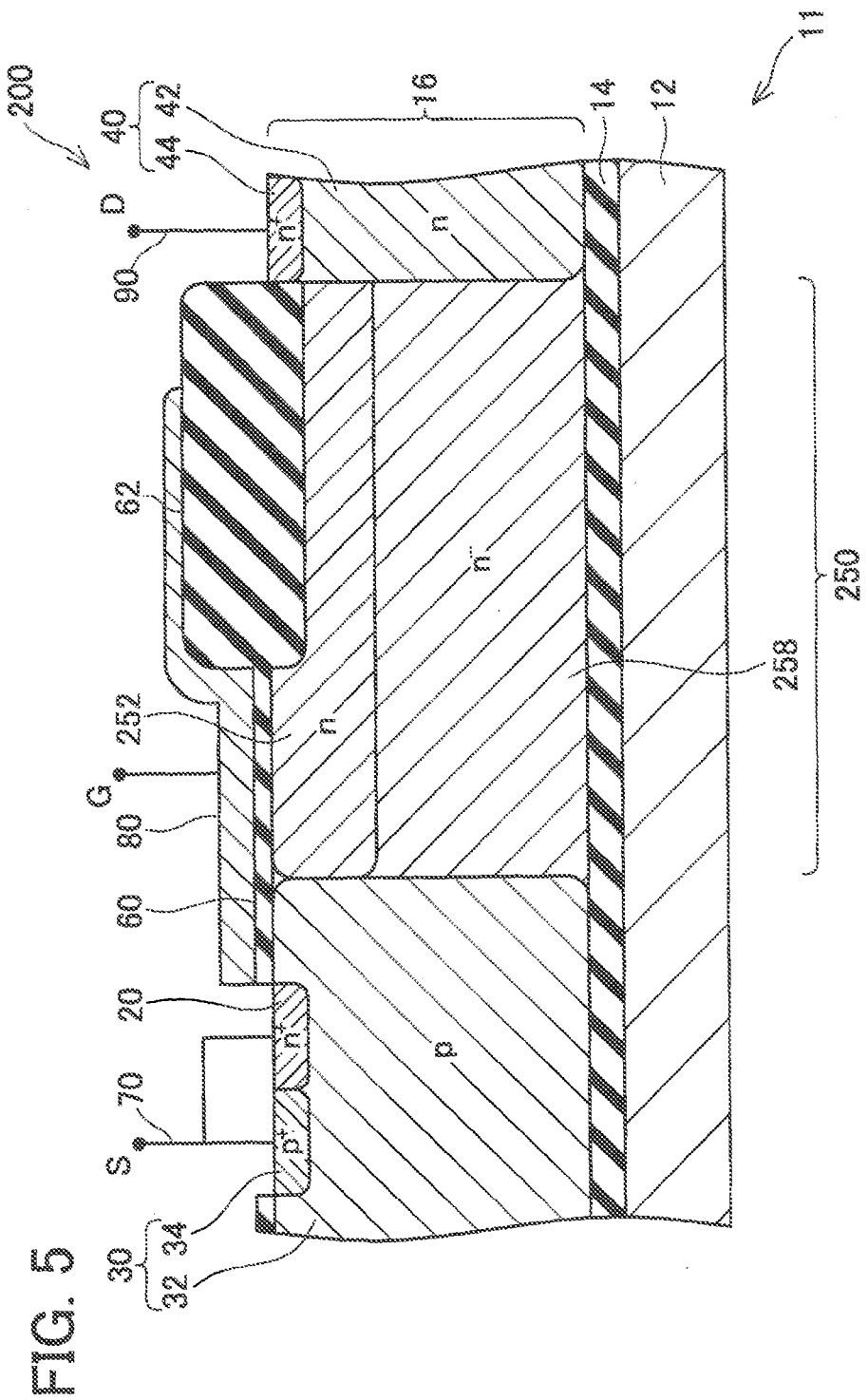
FIG. 5 shows a V-V cross-sectional view of the semiconductor device in FIG. 4.

As shown in FIGS. 4 and 5, the first drift region 252 is formed in a range exposed at the upper surface of the semiconductor layer 16 between a body region 30 and a drain region 40. The first drift region 252 is adjacent to the drain region 40. The first drift region 252 is projected to the body region 30 side than the second drift region 252. The first drift region 252 is adjacent to the body region 30.

Figure 6:
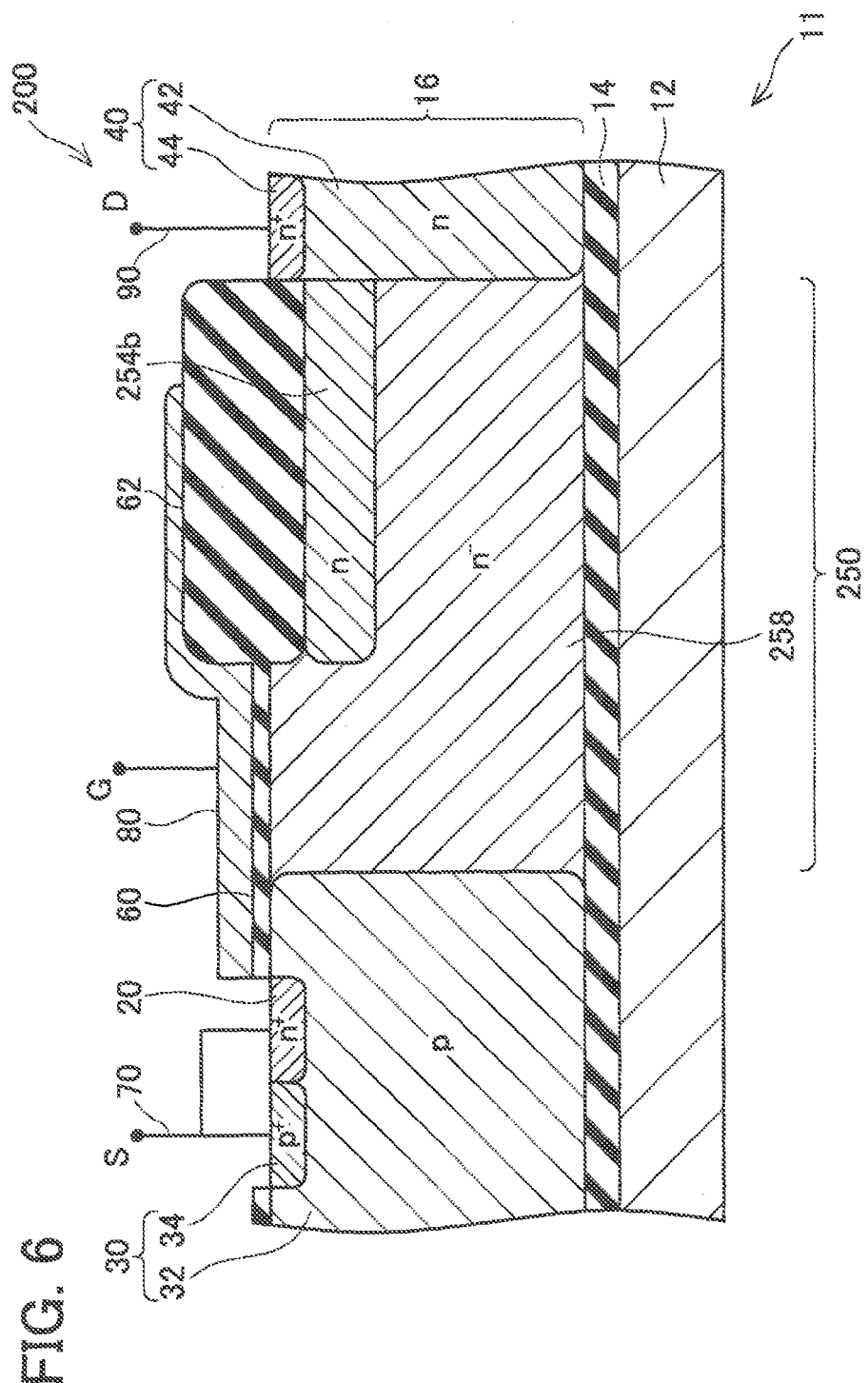
FIG. 6 shows a VI-VI cross-sectional view of the semiconductor device in FIG. 4.

As shown in FIG. 4, in the present embodiment, the second drift region 254a is provided on one side of the first drift region 252, and the second drift region 254b is provided on the other side. The second drift regions 254a and 254b are adjacent to the first drift region 252. As shown in FIGS. 4 and 6, the second drift regions 254a and 254b are adjacent also to the drain region 40. The second drift regions 254a and 254b are projected to the body region 30 side than the third drift regions 256a and 256b. Note here that the second drift regions 254a and 254b are not adjacent to the body region 30.

Figure 7:
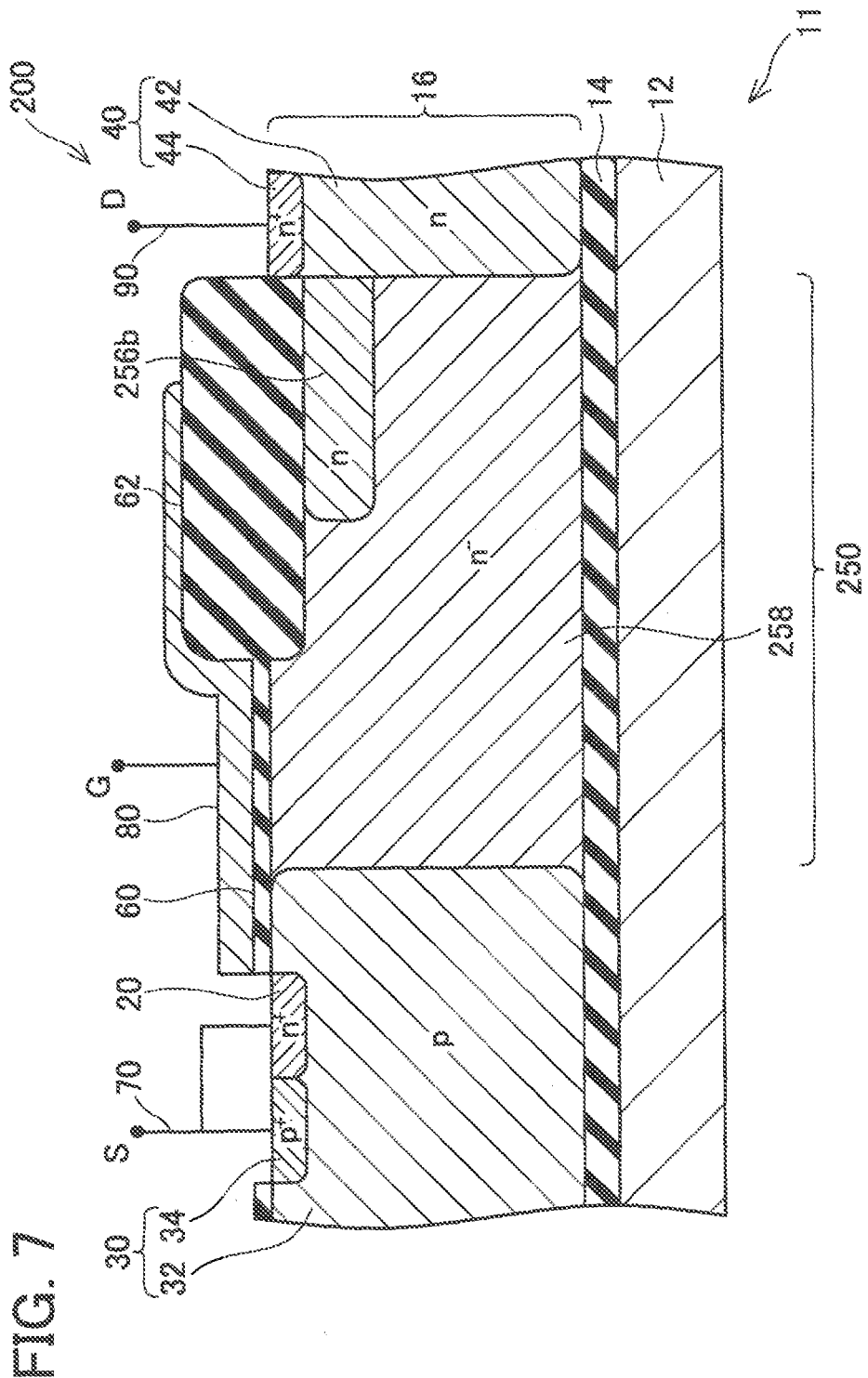
FIG. 7 shows a VII-VII cross-sectional view of the semiconductor device in FIG. 4.

As shown in FIG. 4, in the present embodiment, the third drift region 256a is provided on a side opposite to a side of the second drift region 254a adjacent in contact with the first drift region 252. Similarly, the third drift region 256b is provided on a side opposite to a side of the second drift region 254b in contact with the first drift region 252. The third drift regions 256a and 256b are adjacent to the second drift regions 254a and 254b, respectively. As shown in FIGS. 4 and 7, the third drift regions 256a and 256b are adjacent also to the drain region 40. The third drift region 56 also is not in contact with the body region 30.

In the present embodiment as well, the low-concentration drift region 258 has an n-type impurity concentration lower than the first drift region 252. The low-concentration drift region 258 is formed between the body region 30 and the drain region 40.

Figure 8:
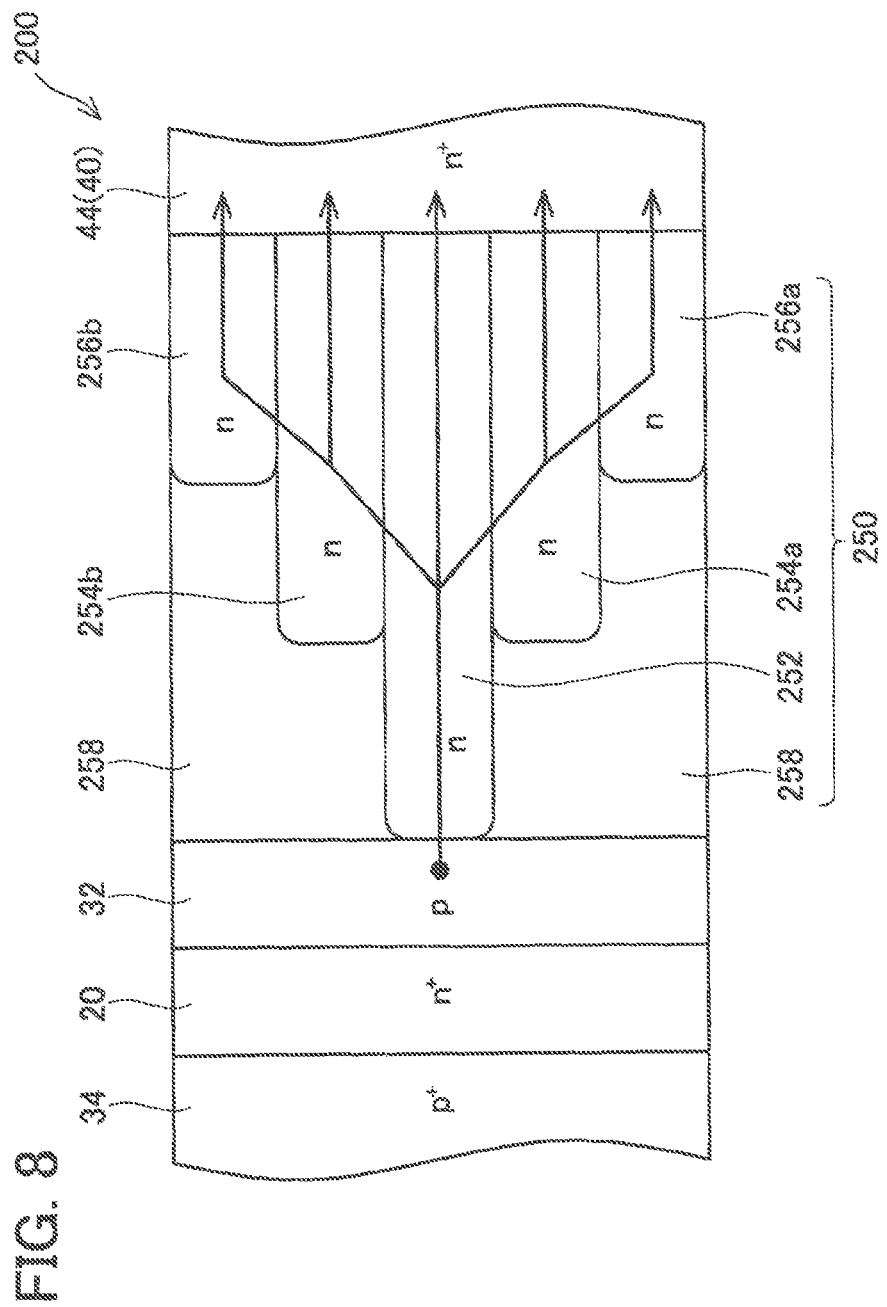
FIG. 8 schematically shows the state at the time of a turn-on operation of the semiconductor device in FIG. 4.

The movement of electrons at the time of a turn-on operation of the semiconductor device 200 of the present embodiment is described below in detail with reference to FIG. 8. Also in the present embodiment, the electrons passed through the n-type channel are introduced into the first drift region 252. As described above, the first drift region 252 is formed in a range exposed at the upper surface of the semiconductor layer 16 between the body region 30 and the drain region 40 (see FIG. 5). That is, the first drill region 252 is formed at a position close to the channel formed in the body region 30. The first drift region 252 is adjacent to the body region 30. The n-type impurity concentration N1 of the first drift region 252 is higher than the n-type impurity concentration N4 of the low-concentration drift region 258. Therefore, the electrons easily flow (i.e., a resistance therefor is low) in the first drift region 252 compared with the low-concentration drift region 258. Thus, most of the electrons passed through the channel are introduced not into the low-concentration drift region 258, but into the first drift region 252.

Some of the electrons introduced into the first drift region 252 pass through the first drift region 252 and are introduced into the drain region 40. On the other hand, the other electrons introduced into the first drift region 252 are introduced into the second drift regions 254a and 254b which are adjacent to the first drift region 252. As described above, the n-type impurity concentration N2 in the second drift regions 254a and 254b is higher than the n-type impurity concentration N1 in the first drift region 252. Therefore, the electrons easily flow in the second drift regions 254a and 254b compared with the first drift region 252. Therefore, the other electrons introduced into the first drift region 252 are introduced into the second regions 254a and 254b.

Similarly, some of the electrons introduced into the second drift regions 254a and 254b pass through the second drift regions 254a and 254b and are introduced into the drain region 40. The other electrons introduced into the second drift regions 254a and 254b are introduced into the third drift regions 256a and 256b which are adjacent to the second drift regions 254b and 254b. The electrons introduced into the third drift regions 256a and 256b pass through the third drift regions 256a and 256b and are introduced into the drain region 40.

As described above, in the semiconductor device 200 of the present embodiment, the electrons passed through the channel in the turn-on operation are spread in the first drift region 252, the second drift regions 254a and 254b, and the third drift regions 256a and 256b and moves in the drain electrode 90 direction. Accordingly, a path through which a current flows at the time of the turn-on operation of the semiconductor device 10 is spread in the lateral direction, and local heating of the semiconductor device 200 can be suppressed.

In the above-mentioned examples, the n-type impurity concentration N4 in the low-concentration drift region 258 is, for example, less than $1\times10^{15}$ atoms/cm$^3$. The n-type impurity concentration N1 in the first drift region 252 is, for example, from $1\times10^{15}$ atoms/cm$^3$ or more and less than $1\times10^{16}$ atoms/cm$^3$. The n-type impurity concentration N2 in the second drift regions 254a and 254b is, for example, from $1\times10^{16}$ atoms/cm$^3$ or more and less than $1\times10^{17}$ atoms/cm$^3$. The n-type impurity concentration N3 in the third drift regions 256a and 256b is, for example, $1\times10^{17}$ atoms/cm$^3$ or more.

While specific examples of the technology disclosed in the present specification is described above in detail, these examples are merely illustrative and place no limitation on the scope of the patent claims. The technology described in the patent claims also encompasses various changes and modifications to the specific examples described above. For example, the following modifications may be employed.

(Modification 1)

Although the first drift regions 52 and 252 are adjacent to the body region 30 in each of the above embodiments, they are not limited to this. The first drift regions 52 and 252 may not be adjacent to the body region 30 as long as they are projected to the body region 30 side than the second drift regions 54, 254a, and 254b. That is, the low-concentration drift regions 58 and 258 may be partially present between the first drift region 52 or 252 and the body region 30. In this case, most of the electrons passed through the channel at the time of the turn-on operation of the semiconductor devices 10 and 200 are introduced into the low-concentration drift regions 58 and 258 which are in the vicinity of the upper surface of the semiconductor layer 16, and then are introduced into the first drift regions 52 and 252.

(Modification 2)

In each of the above embodiments, the drift regions 50 and 250 have the first drift regions 52 and 252, the second drift regions 54, 254a, and 254b, and the third drift regions 56, 256a, and 256b, which have different n-type impurity concentrations. However, the number of regions having different n-type impurity concentrations and provided in the drift regions 50 and 250 is not limited to three and may be any number as long as the number is two or more. Generally, a fourth region of the first conductivity type may be formed in a range exposed at the upper surface, may be formed between the second region and the third region, and may comprise a first drift region and a second drift region and a low a low concentration drift region. The first drift region may be formed in a range exposed at the upper surface between the second region and the third region. The second drift region having a first conductivity type impurity concentration higher than that of the first drift region, and may adjacent to the first drift region positioned between the second region and the third region. The low concentration drift region having a first conductivity type impurity concentration lower than that of the first drift region, and may be formed between the second region and the second drift region. Both of the first drift region and the second drift region may be adjacent to the third region. The first drift region may be projected to a second region side than the second drift region.

(Modification 3)

Although the semiconductor devices 10 and 200 are described as examples of lateral n-channel MOSFET in each of the examples, the semiconductor devices are not limited to the lateral n-channel MOSFET and may be lateral p-channel MOSFET, Also in the case of the p-channel MOSFET, the technology in the above examples can be employed.

Some of the features of the discloses herein will be described. The second drift region may be formed on a far side from the upper surface of the semiconductor substrate than the first drift region. With this configuration, a path through which a current flows at the time of a turn-on operation of the semiconductor device can be spread in a vertical direction.

In the above aspect, the second drift region may be formed on a lateral side of the first drift region in a plane which is parallel to the upper surface of the semiconductor substrate. With this configuration, a path through which a current flows at the time of a turn-on operation of the semiconductor device can be spread in a lateral direction.

In the above aspect, the first drift region may be adjacent to the second region. With this configuration, a resistance until the introduction of carriers into the first drift region after passing through the channel is low. Accordingly, a loss of the semiconductor device can be reduced.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations.

The present invention is not limited to the combinations described at the time the claims are fled. Further, the purpose of the examples illustrated by the present description or drawings is to satisfy multiple objectives simultaneously, and satisfying any one of those objectives gives technical utility to the present invention.

The invention claimed is:

1. A semiconductor device comprising:
   a source electrode;
   a gate electrode;
   a drain electrode;
   a first region of a first conductivity type formed in a range exposed at an upper surface of a semiconductor substrate, and making contact with the source electrode;
   a second region of a second conductivity type formed in a range exposed at the upper surface, adjacent to the first region, and facing the gate electrode through a gate insulating layer;
   a third region of the first conductivity type formed in a range exposed at the upper surface, and making contact with the drain electrode; and
   a fourth region of the first conductivity type formed in a range exposed at the upper surface, formed between the second region and the third region, and comprising:
      a first drift region formed in a range exposed at the upper surface between the second region and the third region;
      a second drift region having a first conductivity type impurity concentration higher than that of the first drift region, and adjacent to the first drift region positioned between the second region and the third region; and
      a low concentration drift region having a first conductivity type impurity concentration lower than that of the first drift region, and formed between the second region and the second drift region,
   wherein both of the first drift region and the second drift region are adjacent to the third region, and
   the first drift region is projected to a second region side than the second drift region.

2. The semiconductor device as in claim 1, wherein the second drift region is formed on a far side from the upper surface of the semiconductor substrate than the first drift region.

3. The semiconductor device as in claim 1, wherein the second drift region is formed on a lateral side of the first drift region in a plane which is parallel to the upper surface of the semiconductor substrate.

4. The semiconductor device as in claim 1, wherein the first drift region is adjacent to the second region.

* * * * *